(12) United States Patent
Tsai et al.

(10) Patent No.: US 9,935,132 B2
(45) Date of Patent: Apr. 3, 2018

(54) PIXEL STRUCTURE

(71) Applicant: Au Optronics Corporation, Hsinchu (TW)

(72) Inventors: Ai-Ju Tsai, Hsinchu County (TW); Chang-Hung Lee, New Taipei (TW); Ming-Hsien Lee, Hsinchu (TW); Chen-Kang Li, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/183,811

(22) Filed: Jun. 16, 2016

(65) Prior Publication Data
US 2017/0069663 A1 Mar. 9, 2017

(30) Foreign Application Priority Data
Sep. 7, 2015 (TW) .............................. 104129476 A

(51) Int. Cl.
| H01L 27/12 | (2006.01) |
| H01L 29/417 | (2006.01) |
| H01L 29/66 | (2006.01) |
| H01L 29/786 | (2006.01) |
| G02F 1/1335 | (2006.01) |
| G02F 1/1343 | (2006.01) |
| G02F 1/1362 | (2006.01) |
| G02F 1/1368 | (2006.01) |

(52) U.S. Cl.
CPC ...... *H01L 27/124* (2013.01); *G02F 1/136227* (2013.01); *H01L 27/1222* (2013.01); *H01L 29/41733* (2013.01); *H01L 29/6675* (2013.01); *H01L 29/78672* (2013.01); *G02F 2001/136222* (2013.01)

(58) Field of Classification Search
CPC ......... H01L 29/78675; H01L 29/78633; H01L 27/1222; H01L 27/124; H01L 29/41733; H01L 29/6675; H01L 29/78672; G02F 1/136227; G02F 2001/136222
See application file for complete search history.

(56) References Cited

U.S. PATENT DOCUMENTS

| 2011/0031517 | A1* | 2/2011 | Huang | .............. | H01L 29/78633 257/98 |
| 2016/0343747 | A1* | 11/2016 | Du | ........................ | G02F 1/1362 |

* cited by examiner

*Primary Examiner* — Tom Thomas
*Assistant Examiner* — Benjamin Tzu-Hung Liu
(74) *Attorney, Agent, or Firm* — JCIPRNET

(57) ABSTRACT

A pixel structure including scan lines, data lines, and sub-pixels is provided. The scan and data lines are disposed on the substrate. The sub-pixels include switch devices, contact pattern layer, color filter pattern layers, and pixel electrodes. The switch devices are electrically connected to one scan line and one data line respectively. The contact pattern layer and the color filter pattern layer are disposed on the substrate and the switch devices. The contact pattern layer covers part of two adjacent switch devices. At least two color filter pattern layers include a patterned opening respectively, and the contact pattern layer is disposed in the patterned opening. The pixel electrodes are disposed on the color filter pattern layer, the contact pattern layer, and the switch device. At least one pixel electrode is partially disposed between the color filter pattern layer and the corresponding switch device while electrically connected to the switch device.

8 Claims, 17 Drawing Sheets

PIXEL STRUCTURE

CROSS-REFERENCE TO RELATED APPLICATION

This application claims the priority benefit of Taiwan application serial no. 104129476, filed on Sep. 7, 2015. The entirety of the above-mentioned patent application is hereby incorporated by reference herein and made a part of this specification.

BACKGROUND OF THE INVENTION

1. Field of the Invention

The present invention generally relates to a pixel structure, in particular, to a pixel structure that a contact pattern layer is shared between two adjacent sub-pixels.

2. Description of Related Art

In recent years, low temperature poly-silicon (LTPS) liquid crystal display is a mainstream design of consumer product development recently, of which main application is a small and medium size liquid crystal display with high degree of integration and high definition. However, the display with high definition has higher pixel density. Thus, the size of each sub-pixel is also reduced relatively. Since the size of sub-pixel is smaller, the process difficulty of the contact window between the pixel electrode and the drain electrode in the sub-pixel is also increased. Furthermore, when the desired size of the contact window is smaller than the process limitation, the contact window cannot be formed, such that the pixel electrode cannot electrically connect to the drain electrode successfully that causing the liquid crystal molecules cannot be driven by the pixel electrode correctly. In this situation, the sub-pixel will not display normally, thus the display quality is deteriorated.

SUMMARY OF THE INVENTION

The invention provides a pixel structure to enhance the display quality.

In an embodiment of the invention, a pixel structure disposed on a substrate is provided. The pixel structure includes a plurality of scan lines, a plurality of data lines, and a plurality of sub-pixels. The sub-pixel includes a plurality of switch devices, a contact pattern layer, a plurality of color filter pattern layers, and a plurality of pixel electrodes. Each of the switch devices is electrically connected to one of the scan lines and one of the data lines respectively. The contact pattern layer and the color filter pattern layers are disposed on the substrate and the switch devices. The contact pattern layer covers at least part of two adjacent switch devices. At least two of the color filter pattern layers each includes a patterned opening respectively, and the contact pattern layer is disposed in the patterned opening. The pixel electrode is disposed on the color filter pattern layers, the contact pattern layer, and the switch devices. At least one pixel electrode is partially disposed between the color filter pattern layer and the corresponding switch devices while electrically connected to the switch devices.

Based on the above, the contact pattern layer is shared between two adjacent sub-pixels, and different patterned transparent conductive layers are used as extension of the drain electrode to extend upper layer of the present invention, such that the most upper layer of the patterned transparent conductive layer is electrically connected to the drain electrode via the patterned transparent conductive layer thereunder. Thereby, the process of the contact window in the pixel structure may not be restricted by the size of the pixel structure and the process limitation, and the most upper layer of the patterned transparent conductive layer is electrically connected to the drain electrode indeed to provide better display quality.

Several exemplary embodiments accompanied with figures are described in detail below to further describe the invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 11A are schematic top views illustrating a manufacturing process of a pixel structure according to an embodiment of the invention.

FIG. 1B to FIG. 11B are schematic cross-sectional views illustrating a manufacturing process taken along sectional lines A-A' and B-B' depicted in FIG. 1A to FIG. 11A.

DESCRIPTION OF THE EMBODIMENTS

FIG. 1A to FIG. 11A are schematic top views illustrating a manufacturing process of a pixel structure according to an embodiment of the invention. FIG. 1B to FIG. 11B are schematic cross-sectional views illustrating a manufacturing process taken along sectional lines A-A' and B-B' depicted in FIG. 1A to FIG. 11A. The manufacturing process of the pixel structure of the invention is illustrated sequentially thereinafter.

Figure 1A:
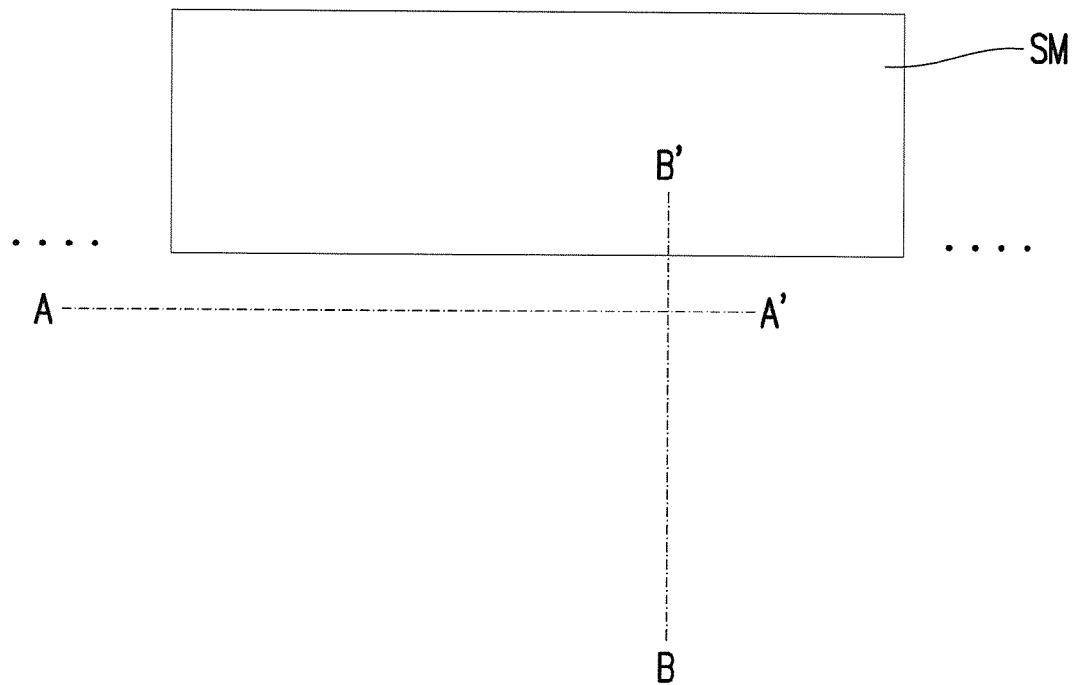
Figure 1A:
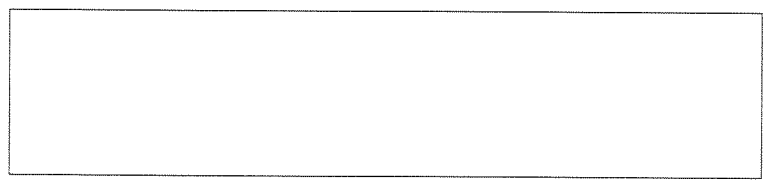
Figure 1B:
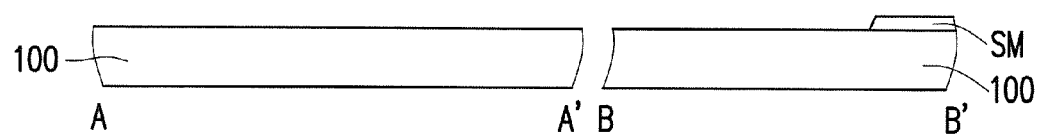

Referring to FIG. 1A and FIG. 1B at the same time, a substrate 100 is provided. A material of the substrate 100 may be glass, quartz, organic polymer, or other suitable materials. Then, a light shielding layer SM is formed on the substrate 100. The purpose of the light shielding layer SM is to shield metal traces formed in the following process. In other words, the light shielding layer SM is a black matrix layer of the pixel structure substantially in the embodiment. In the embodiment, a material of the light shielding layer SM is metal; however, the invention is not limited thereto. In other embodiments, a material of the light shielding layer SM may be a light sensitive resin material or other opaque materials. It should be mentioned that, in other embodiments, the light shielding layer SM may be omitted.

Figure 2B:
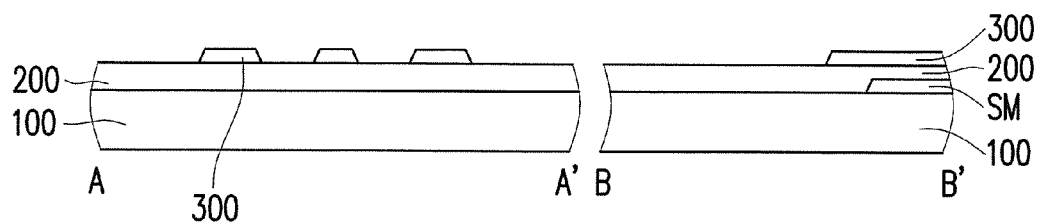
Figure 2A:
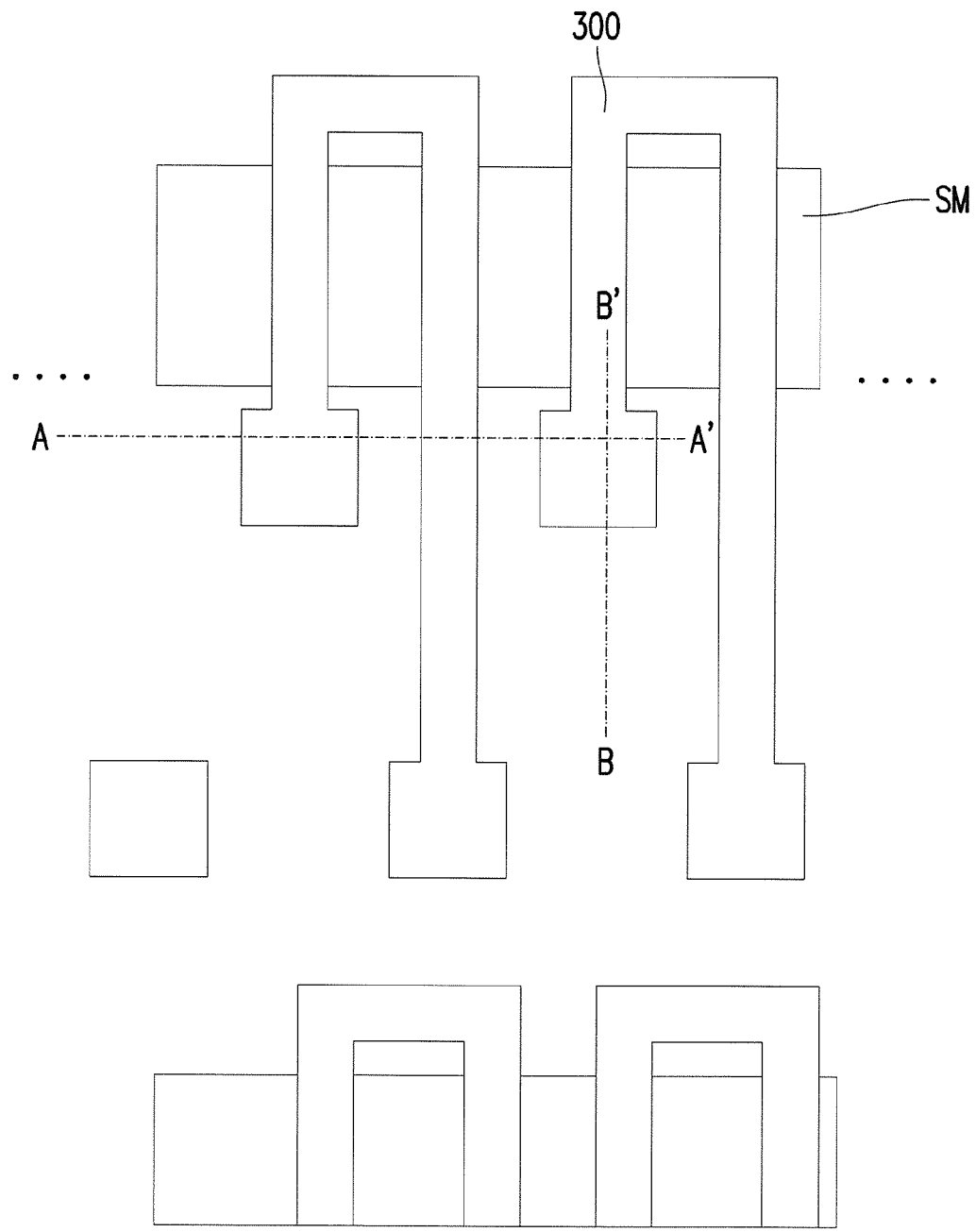

Referring to FIG. 2A and FIG. 2B at the same time, after the light shielding layer SM is formed, a buffer layer 200 and a poly-silicon layer 300 are formed on the substrate 100 and the light shielding layer SM sequentially. The purpose of the buffer layer 200 is to strength the adhesion of the poly-silicon layer 300. Specifically, since the material of the substrate 100 is glass, quartz, or organic polymer, etc, of which the adhesion of silicon atoms is poor. Thus, the material of the buffer layer 200 using such as silicon nitride may enable the poly-silicon layer 300 to deposit and adhere on the buffer layer 200 preferably. A method of forming the poly-silicon layer 300 includes forming an amorphous silicon layer (not shown) on the buffer layer 200. Then, an annealing process is performed on the amorphous silicon layer to transfer the amorphous silicon layer into the poly-silicon layer 300; however, the invention is not limited thereto. The poly-silicon layer in the embodiment may be formed by using any known methods. In the poly-silicon layer 300, parts of region include dopants so as to form a source electrode region and a drain electrode region (not shown).

Figure 3A:
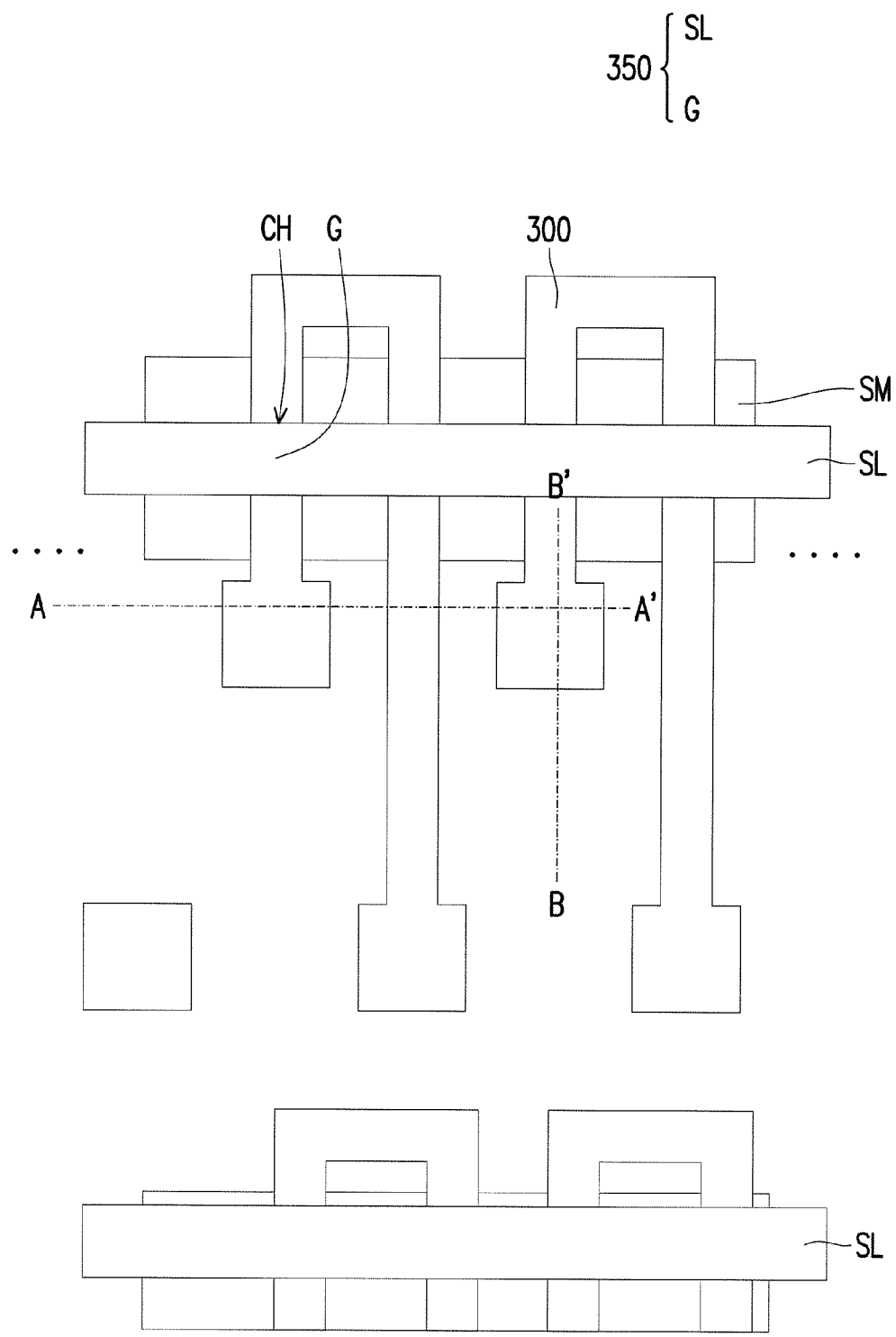
Figure 3B:
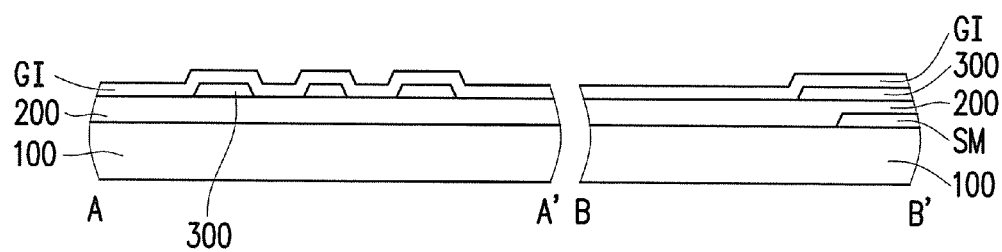

Referring to FIG. 3A and FIG. 3B at the same time, a gate insulating layer GI and a first patterned metal layer 350 are formed on the buffer layer 200 and the poly-silicon layer 300 sequentially. The gate insulating layer GI completely covers the buffer layer 200 and the poly-silicon layer 300. A material of the gate insulating layer GI includes inorganic materials (e.g., silicon oxide, silicon nitride, silicon oxynitride, other suitable materials, or a stacked layer composed of at least two above-mentioned materials), organic materials, other suitable materials, or a combination thereof. That is, the material of the gate insulating layer GI and the material of the buffer layer 200 may be the same or different. A material of the first patterned metal layer 350 may be an alloy, metal nitride materials, metal oxide materials, metal oxynitride materials, a stacked layer composed of metal materials with other conductive materials, or other suitable materials. The first patterned metal layer 350 is a plurality of signal lines SL of the pixel structure substantially in the embodiment. It should be mentioned that, a gate electrode G is formed from the part where the first pattered metal layer 350 and the poly-silicon layer 300 are overlapped, and a channel CH is formed from the part where the poly-silicon layer 300 and the first patterned metal layer 350 are overlapped. As above-mentioned, since the gate insulating layer GI completely covers the buffer layer 200 and the poly-silicon layer 300, the gate electrode G of the first patterned metal layer 350 and the channel CH of the poly-silicon layer 300 are separated by the gate insulating layer GI and electrically insulated from each other. In another aspect, as above-mentioned, since the purpose of the light shielding layer SM is to shield the metal traces, the light shielding layer SM is distributed between the substrate 100 and the scan lines SL. In other words, at least parts of the light shielding layer SM and the scan lines SL are overlapped as shown in FIG. 3A.

Figure 4B:
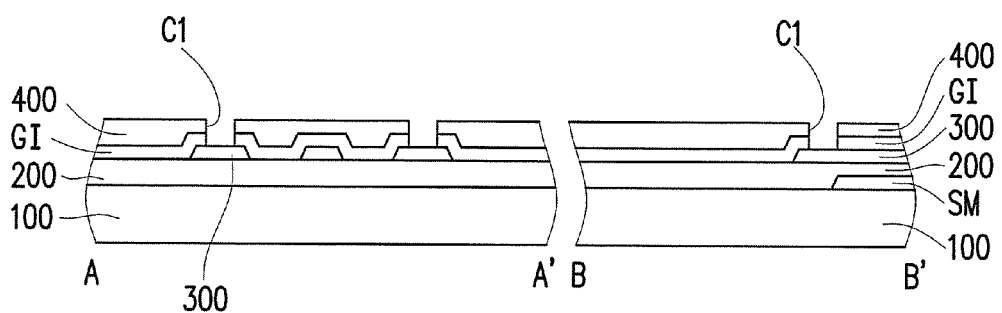
Figure 4A:
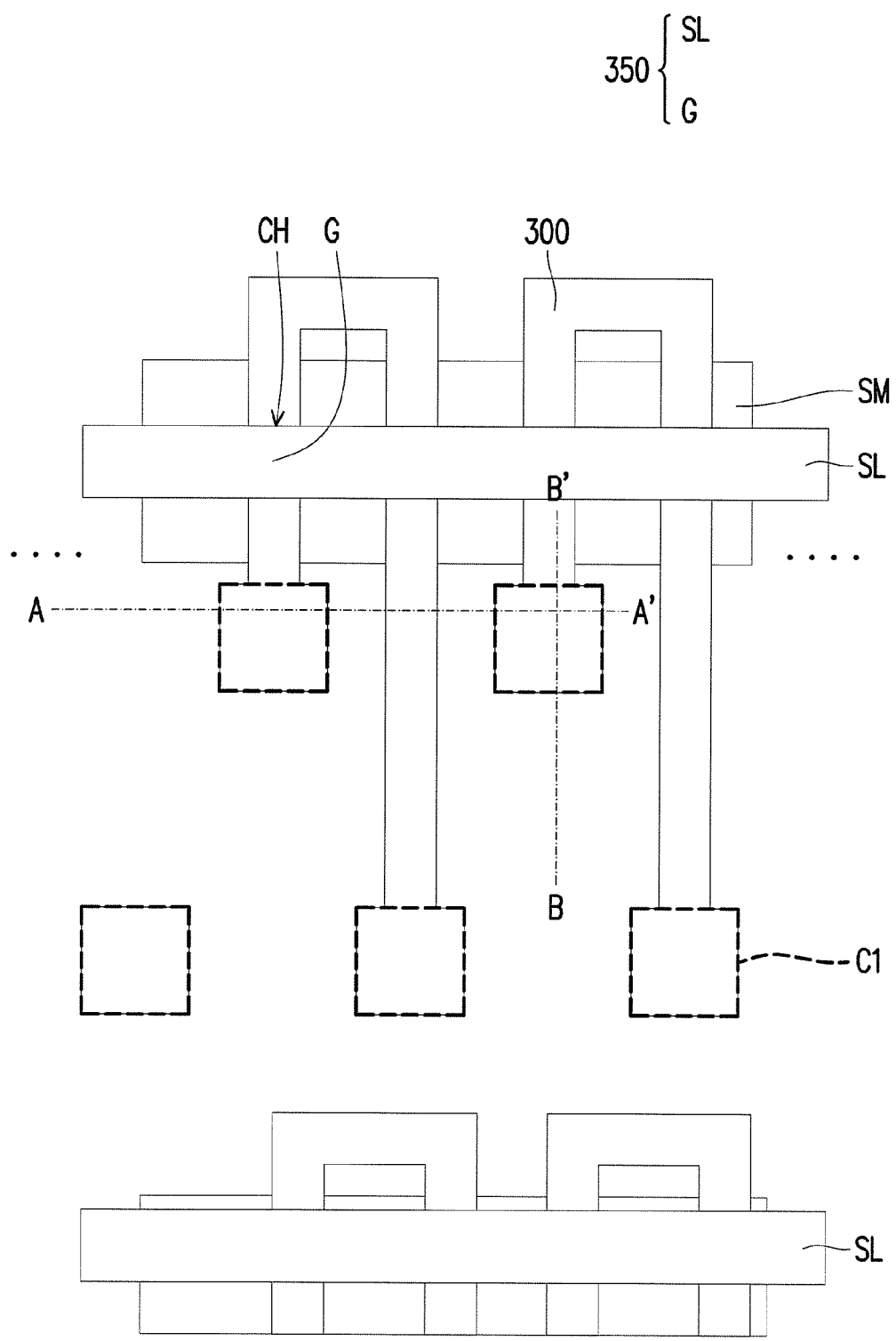

After that, referring to FIG. 4A and FIG. 4B at the same time, an inter-layer dielectric layer 400 is formed to cover the gate insulating layer GI and the first patterned metal layer 350. The inter-layer dielectric layer 400 includes a plurality of openings to form a plurality of gate insulating layer contact windows C1 penetrating the inter-layer dielectric layer 400 and the gate insulating layer GI. That is, the gate insulating layer contact windows C1 expose parts of the poly-silicon layer 300. The material of the inter-layer dielectric layer 400 and the material of the gate insulating layer GI may be the same or different. The material of the inter-layer dielectric layer 400 is not limited in the invention, so long as the material of the inter-layer dielectric layer 400 is an insulating material.

Figure 5A:
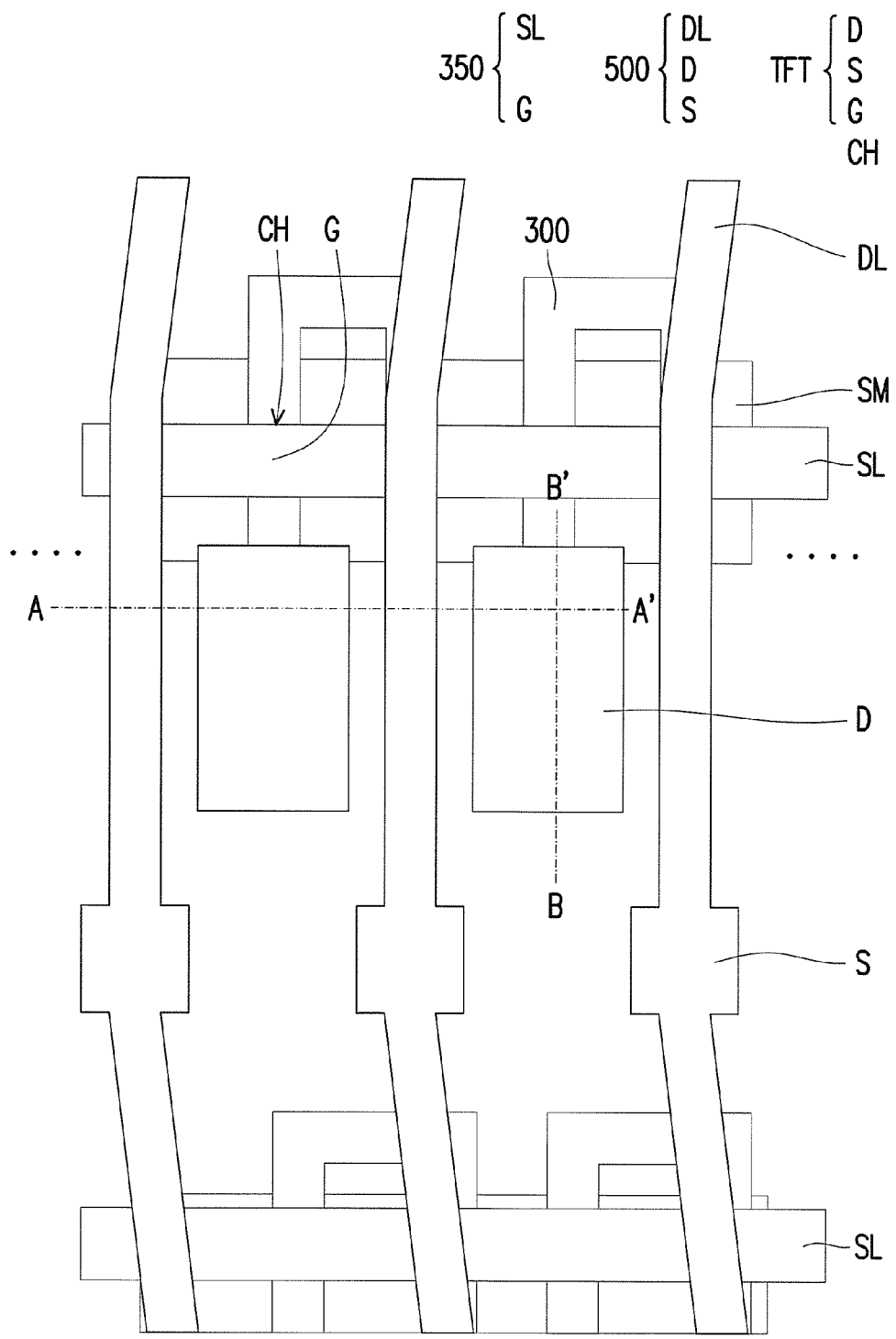
Figure 5B:
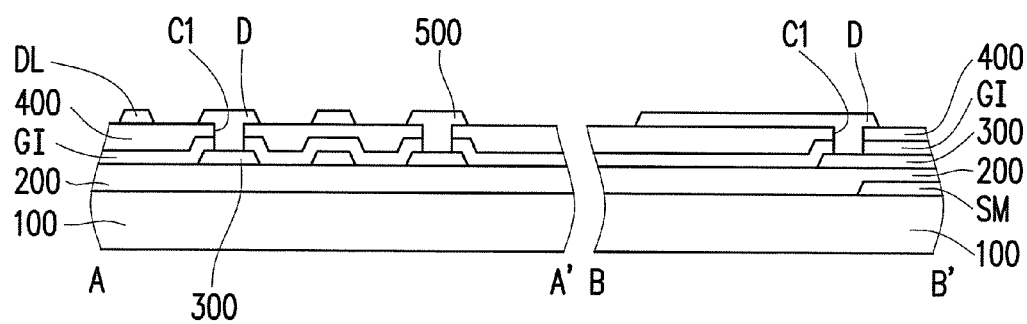

Referring to FIG. 5A and FIG. 5B at the same time, a second patterned metal layer 500 is formed on the inter-layer dielectric layer 400. A source electrode S and a drain electrode D are formed respectively from parts of the second patterned metal layer 500 filled in the gate insulating layer contact window C1 while a plurality of data lines DL are formed from the second patterned metal layer 500 not filled in the gate insulating layer contact window C1. That is, the second patterned metal layer 500 includes the source S, the drain electrode D, and the data lines DL, and the source electrode S and the drain electrode D are connected to the poly-silicon layer 300 via the gate insulating layer contact window C1 respectively. A material of the second patterned metal layer 500 may be an alloy, metal nitride materials, metal oxide materials, metal oxynitride materials, a metal material, a stacked layer composed of metal materials with other conductive materials, or other suitable materials similar to the first patterned metal layer 350. In other words, the material of the first patterned metal layer 350 and the material of the second patterned metal layer 500 may be the same or different. In another aspect, the scan lines SL are intersected with the data lines DL. In other words, an extending direction of the scan lines SL is not parallel to an extending direction of the data lines DL. Preferably, the extending direction of the scan lines SL is substantially perpendicular to the extending direction of the data lines DL. As above-mentioned, since the purpose of the light shielding layer SM is to shield the metal traces, the light shielding layer SM is distributed between the substrate 100 and the data lines DL. In other words, at least parts of the light shielding layer SM and the data lines DL are overlapped as shown in FIG. 5A.

According to the above-mentioned, a switch device TFT is composed of the gate electrode G, the source electrode S, the drain electrode D, and the channel CH. In another aspect, since the channel CH is formed in the poly-silicon layer 300 in the embodiment, and the source electrode S and the drain electrode D are connected to the drain electrode region and the source electrode region (not shown) in the poly-silicon layer 300 respectively. The switch device TFT is a poly-silicon transistor in the embodiment. In other words, in the embodiment, the source electrode S and the drain electrode D of each switch device TFT are formed in the poly-silicon layer 300. In another aspect, the gate electrode G in the switch device TFT is electrically connected to the scan lines SL, and the source electrode S in the switch device TFT is electrically connected to the data lines DL. That is, each of the switch devices TFT is electrically connected to one scan line SL and one data line DL respectively.

Figure 6B:
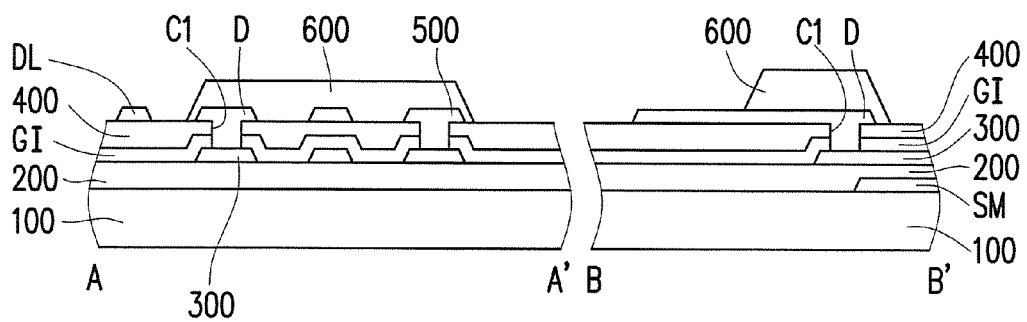
Figure 6A:
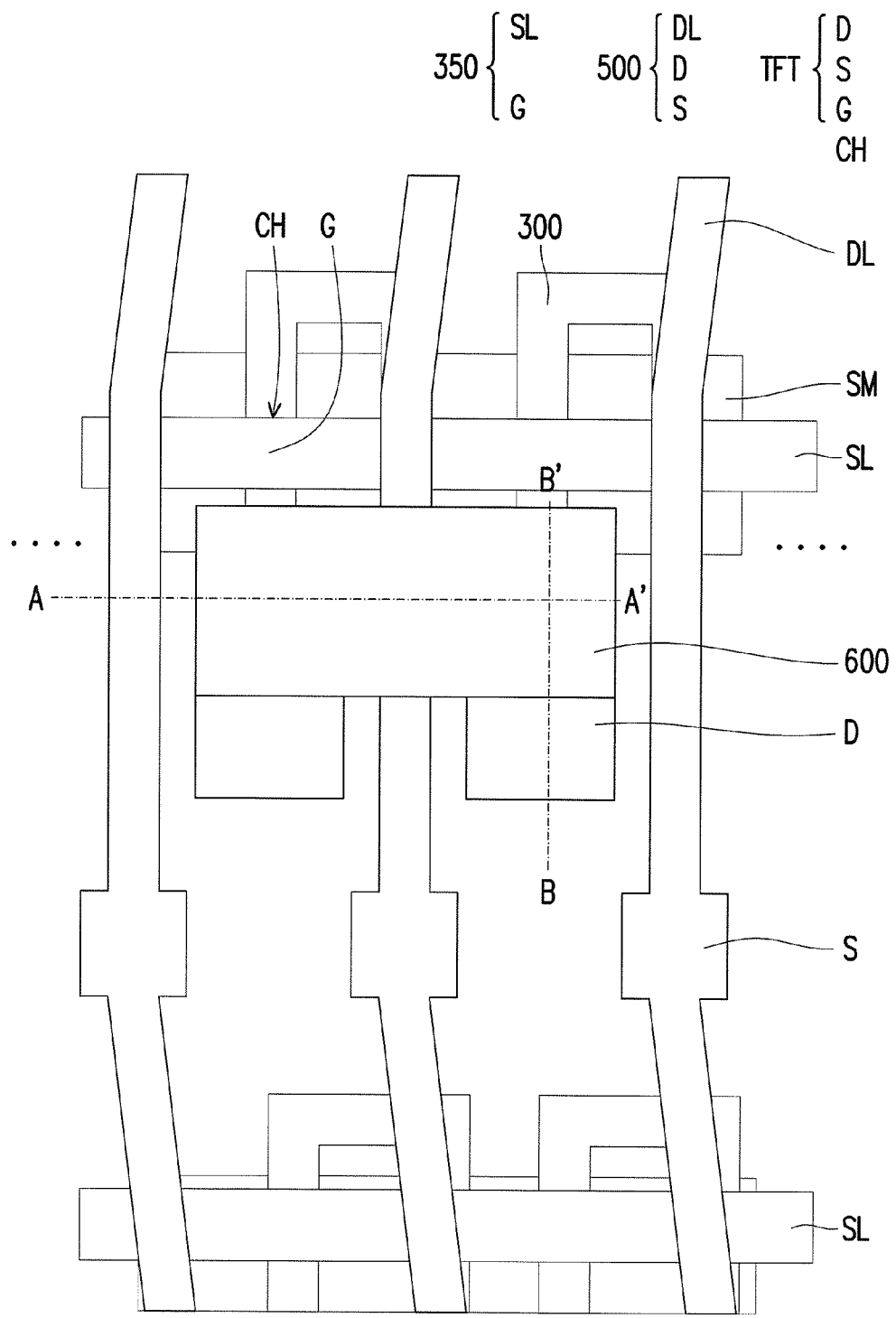
Figure 7A:
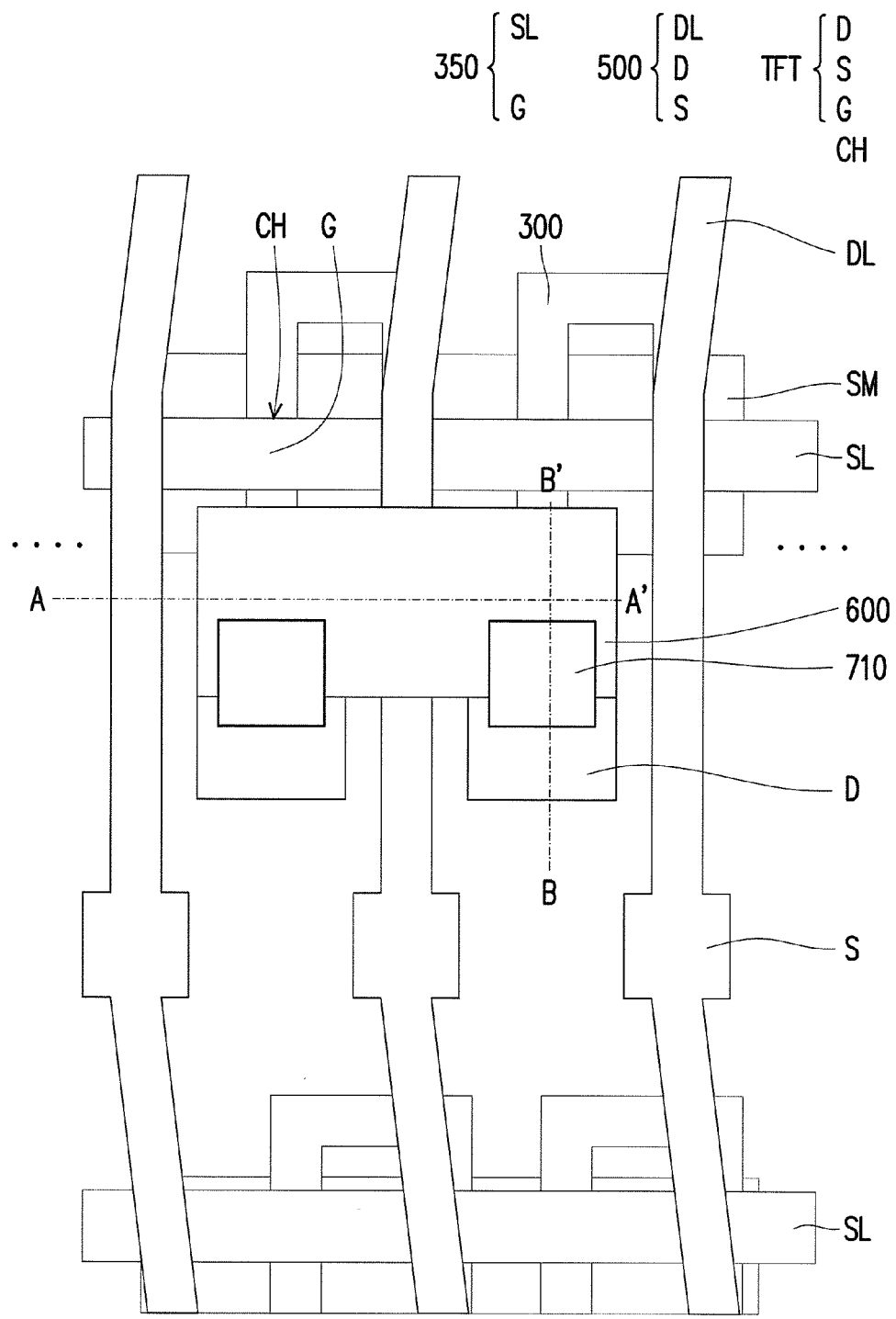
Figure 7B:
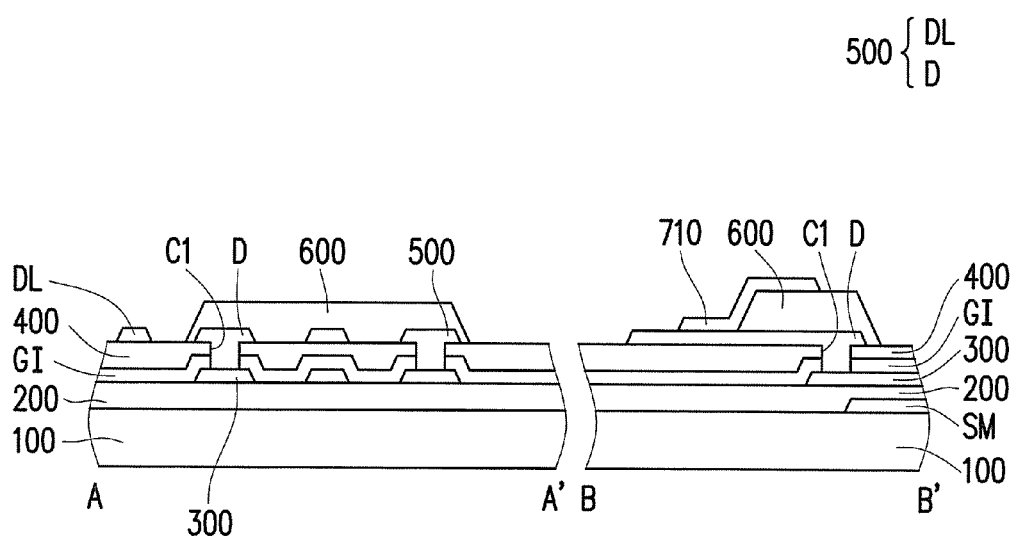

Referring to FIG. 6A and FIG. 6B at the same time, a contact pattern layer 600 is formed on the inter-layer dielectric layer 400 and the second patterned metal layer 500, wherein the contact pattern layer 600 is extended from one side to another side of one data line DL. Particularly, the contact pattern layer 600 covers at least parts of one data line DL of the pixel structure in the embodiment. More particularly, the contact pattern layer 600 covers the above-mentioned at least parts of the drain electrode D of the two sides of one data line DL. That is, the contact pattern layer 600 covers at least parts of two adjacent switch devices TFT as shown in FIG. 6A. A material of the contact pattern layer 600 may be an organic insulating material; however, the invention is not limited thereto. Referring to FIG. 7A and FIG. 7B at the same time, a first patterned transparent conductive layer 710 is formed subsequently. The first patterned transparent conductive layer 710 is disposed on the contact pattern layer 600 and the switch device TFT. The first patterned transparent conductive layer 710 partially covers the contact pattern layer 600 and extends to partially cover the corresponding switch device TFT, so that it is directly contacted and electrically connected to the corresponding switch device TFT. In other words, the first patterned transparent conductive layer 710 and the drain electrode D of the switch device TFT are directly contacted and electrically connected to each other, and further extends to the contact pattern layer 600 top so as to cover parts of the contact pattern layer 600. Therefore, the first patterned transparent conductive layer 710 extends from a side of the contact pattern layer 600 to the top surface of the contact pattern layer 600. In another aspect, a material of the first patterned transparent conductive layer 710 includes metal oxides, such as indium tin oxide (ITO), indium zinc oxide (IZO), aluminum tin oxide (ATO), aluminum zinc oxide (AZO), indium germanium zinc oxide, other suitable oxides, or a stacked layer composed of at least two above-mentioned materials.

Figure 8B:
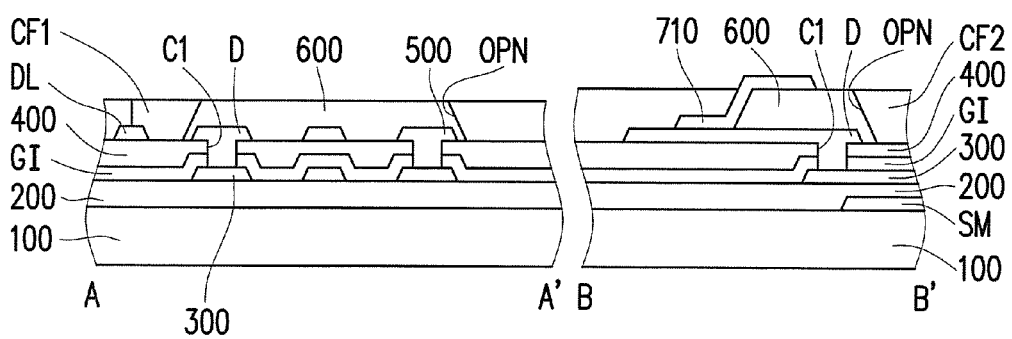
Figure 8A:
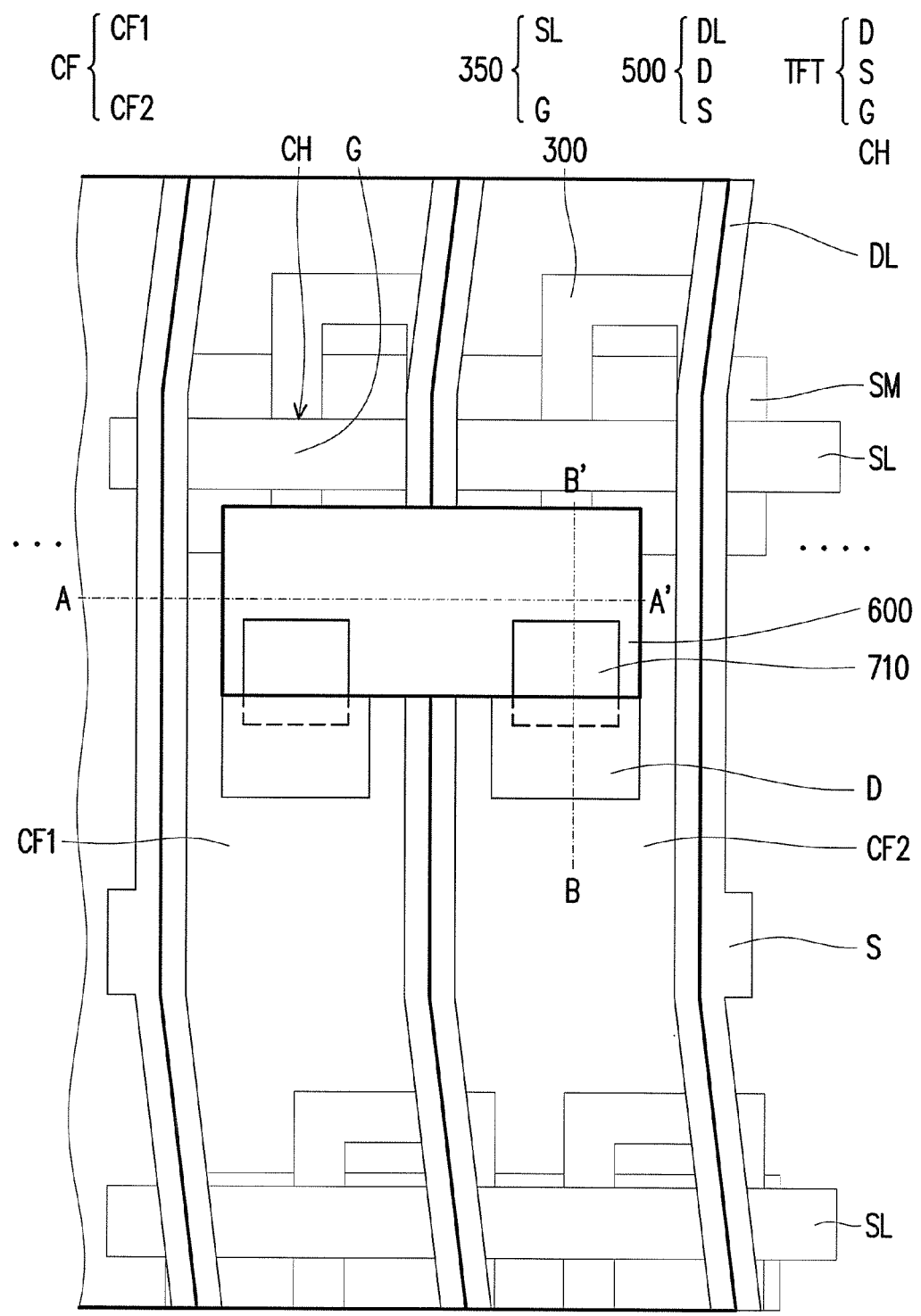

Referring to FIG. 8A and FIG. 8B at the same time, after the first patterned transparent conductive layer 710 is formed, a color filter pattern layer CF is formed at the surroundings of the contact pattern layer 600. The color filter pattern layer CF includes a first color filter pattern CF1 and a second color filter pattern CF2. In other words, the first color filter pattern CF1 and the second color filter pattern CF2 are disposed corresponding to each of the sub-pixels. The first color filter pattern CF1 and the second color filter pattern CF2 include a patterned opening OPN respectively, and the contact pattern layer 600 is disposed in the corresponding patterned opening OPN. It is noted that, since one contact pattern layer 600 is shared between two adjacent sub-pixels in this embodiment, single contact pattern layer 600 is disposed in a space formed from the patterned opening OPN of the first color filter pattern CF1 and the patterned opening OPN of the second color filter pattern CF2. In another aspect, in this embodiment, the color filter pattern layer CF covers the data lines DL, so as to ensure the insulation between the data lines DL and other films formed in the following processes.

As above-mentioned, the first color filter pattern CF1 and the second color filter pattern CF2 may be selected from red, green, or blue color filter patterns; however, the invention is not limited thereto. In another aspect, color of the first color filter pattern CF1 and color of the second color filter pattern CF2 may be the same or different; however, the invention is not limited thereto. Otherwise, the color filter pattern layer CF and the switch device TFT are disposed on the same substrate 100 in the embodiment, so as to form the structure of the color filter layer on array (COA).

Figure 9A:
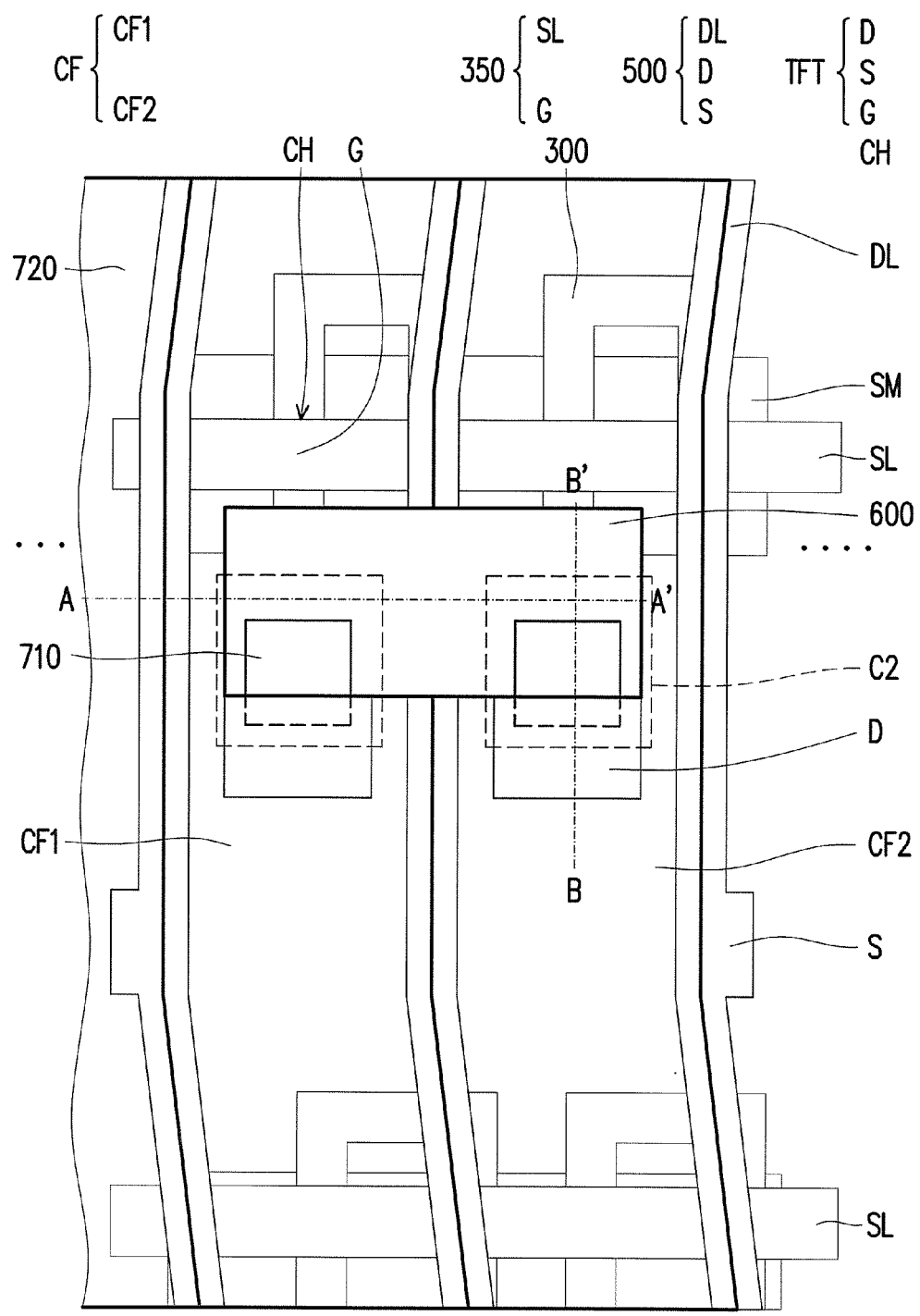
Figure 9B:
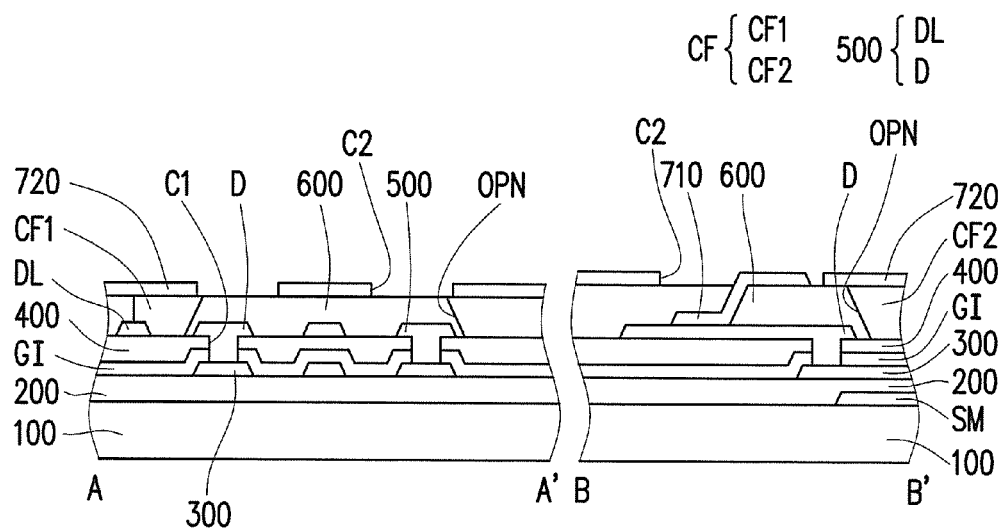

Referring to FIG. 9A and FIG. 9B at the same time, a second patterned transparent conductive layer 720 is formed on the color filter pattern layer CF and the contact pattern layer 600. The second patterned transparent conductive layer 720 includes a plurality of first contact windows C2, and the first contact windows C2 expose parts of the first patterned transparent conductive layer 710 and the contact pattern layer 600. In other words, the second patterned transparent conductive layer 720 covers the pixel structure entirely, and only parts of the first patterned transparent conductive layer 710 and the contact pattern layer 600 are exposed, so as to form a transverse electric field (not shown) with the first patterned transparent conductive layer 710. A material of the second patterned transparent conductive layer 720 and a material of the first patterned transparent conductive layer 710 may be the same or different; however, the invention is not limited thereto.

Figure 10B:
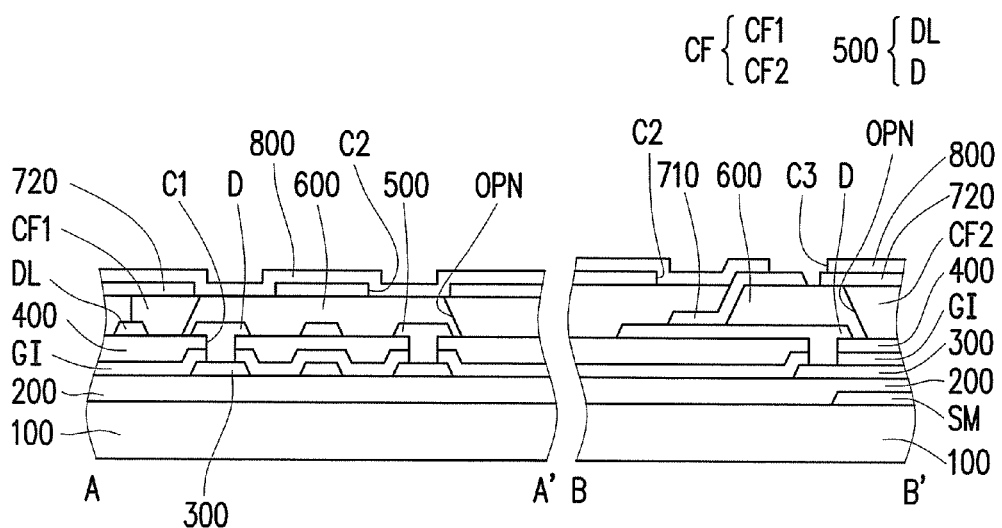
Figure 10A:
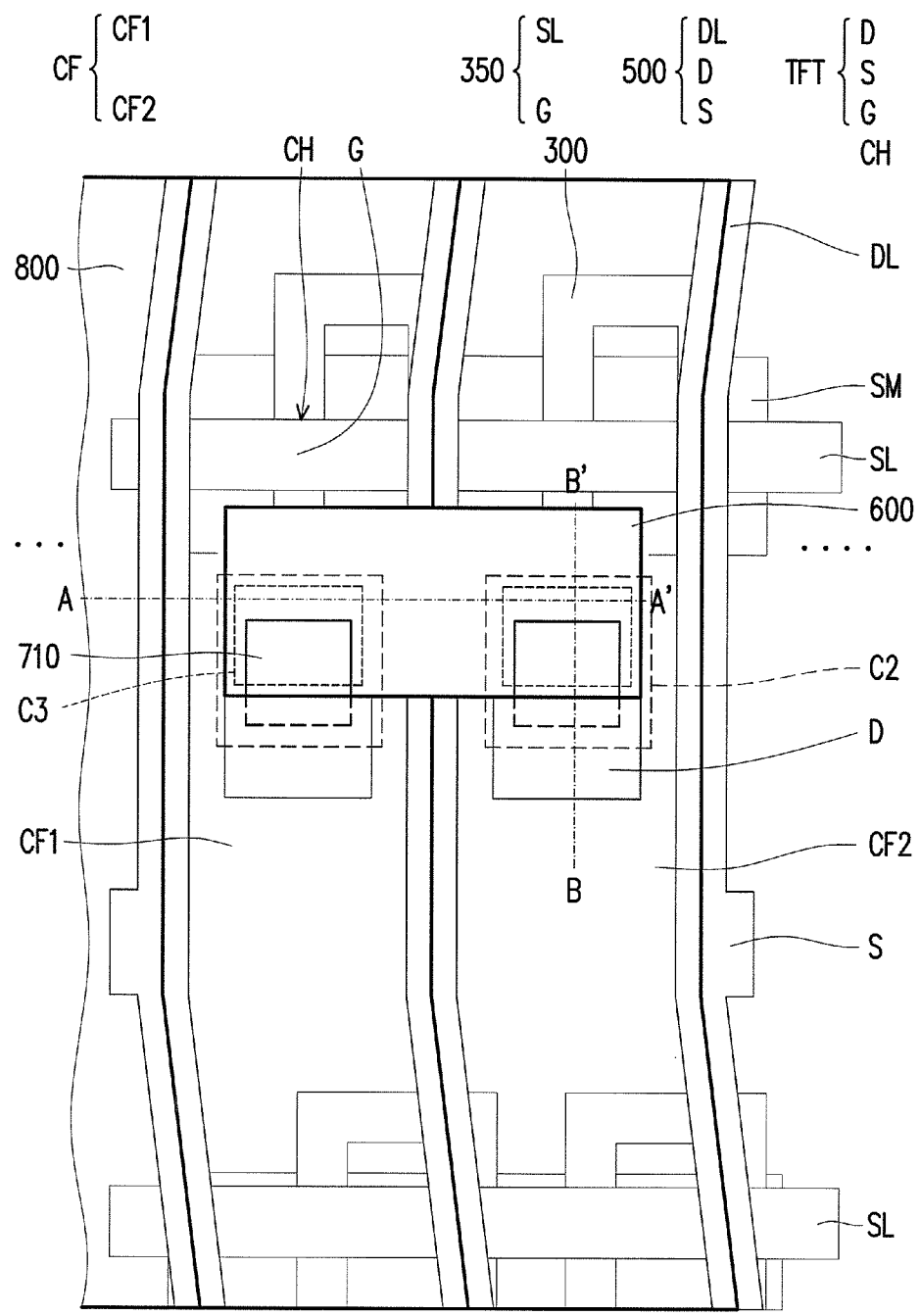

Thereafter, referring to FIG. 10A and FIG. 10B at the same time, after the second patterned transparent conductive layer 720 is formed, further including the steps to form a protective layer 800. In other words, the protective layer 800 covers the second patterned transparent conductive layer 720, the contact pattern layer 600, and the color filter pattern layer CF, so as to achieve protecting these devices. A material of the protective layer 800 includes inorganic materials (e.g., silicon oxide, silicon nitride, silicon oxynitride, other suitable materials, or a stacked layer composed of at least two above-mentioned materials), organic materials, other suitable materials, or a combination thereof. Otherwise, the protective layer 800 further includes a plurality of second contact windows C3. The second contact windows C3 exposes parts of the first patterned transparent conductive layer 710 and the contact pattern layer 600 similar to the first contact windows C2.

Figure 11A:
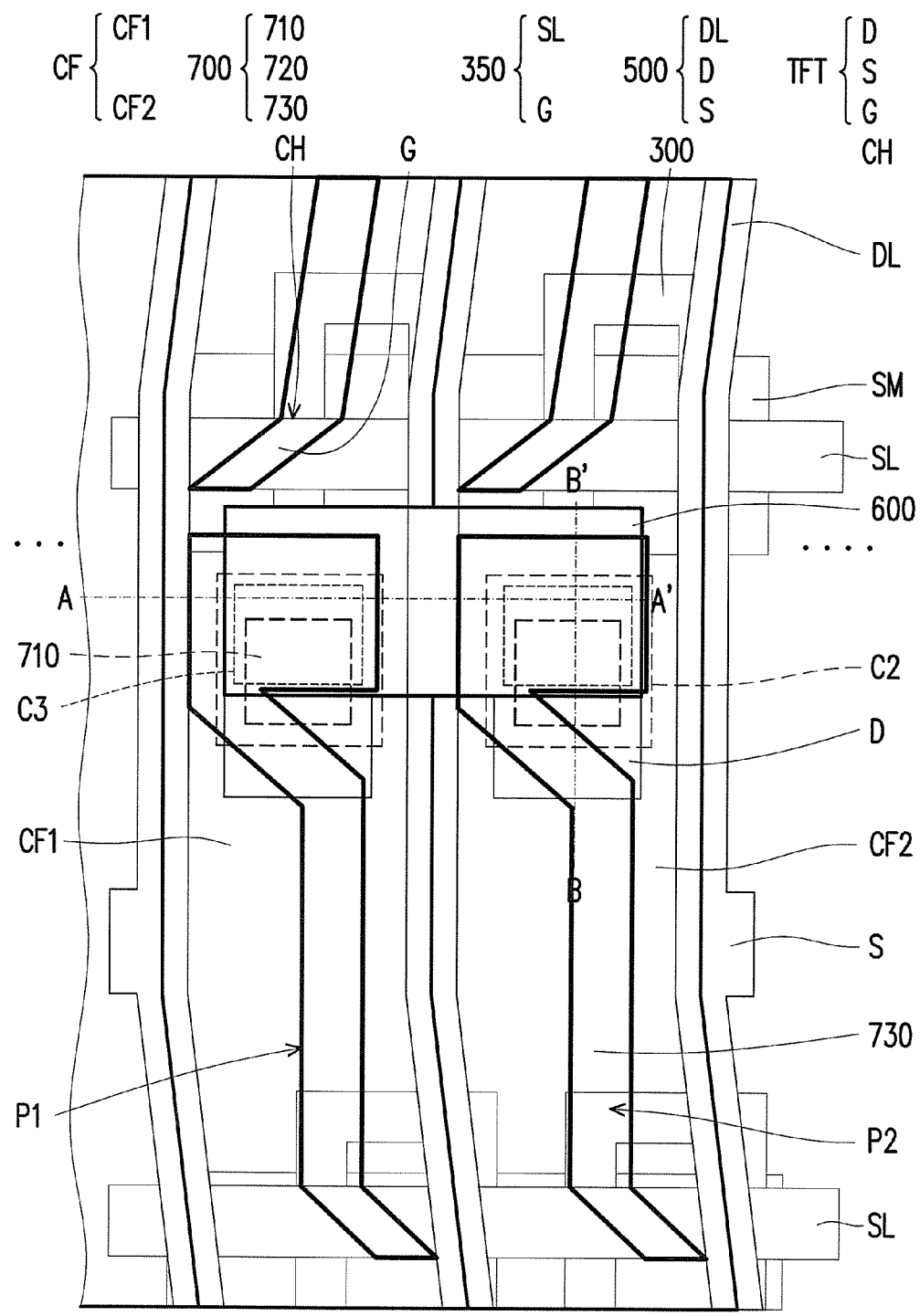
Figure 11B:
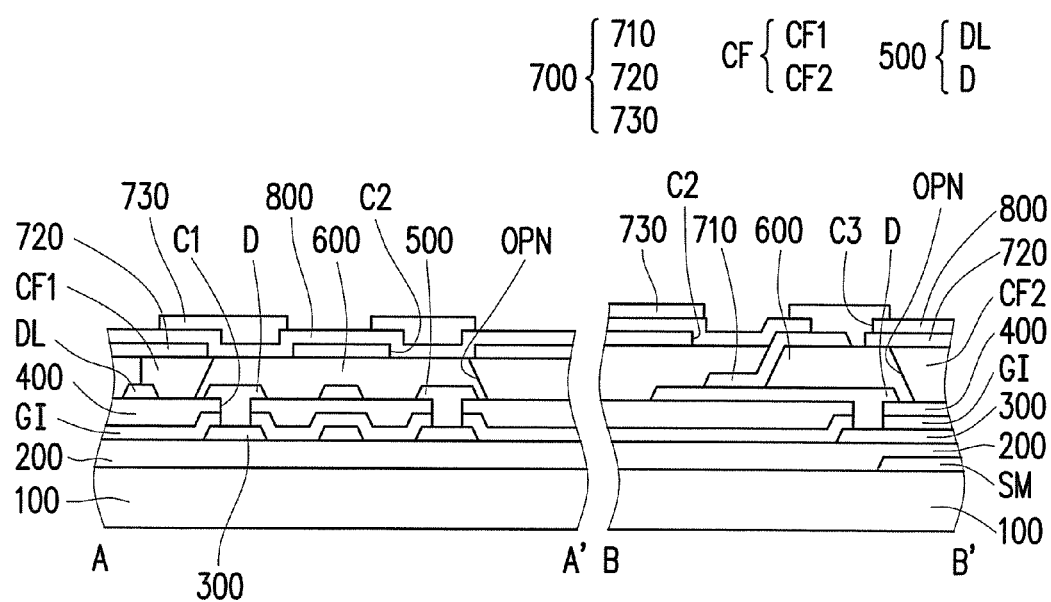

Referring to FIG. 11A and FIG. 11B at the same time, a third patterned transparent conductive layer 730 is formed on the protective layer 800. A material of the third patterned transparent conductive layer 730 may be the same or different from the material of the first patterned transparent conductive layer 710 and the second patterned transparent conductive layer 720. The third patterned transparent conductive layer 730 is directly contacted and electrically connected to the first patterned transparent conductive layer 710 via the second contact windows C3 throughout the protective layer 800. As above-mentioned, since the drain electrode D of the switch device TFT is electrically connected to the first patterned transparent conductive layer 710, the third patterned transparent conductive layer 730 is electrically connected to the drain electrode D of the switch device TFT via the first patterned transparent conductive layer 710.

In this step, the pixel structure P of the embodiment is almost completed, and the pixel structure P includes two adjacent sub-pixels P1 and P2. In this embodiment, one contact pattern layer 600 is shared between the two adjacent sub-pixels P1 and P2 so that the drain electrode D of the switch device TFT of the sub-pixels P1 and P2 may extend to higher plane along the contact pattern layer 600, and the third patterned transparent conductive layer 730 may be electrically connected to the drain electrode D of the switch device TFT via the extended first patterned transparent conductive layer 710. Thus, the contact windows connected to the pixel electrode 700 and the drain electrode D are not restricted by the process limitation, and the process difficulty is decreased.

To sum up, the contact pattern layer is shared between two adjacent sub-pixels, and different patterned transparent conductive layers are used as extension of the drain electrode to extend upper layer of the present invention, such that the most upper layer of the patterned transparent conductive layer is electrically connected to the drain electrode via the patterned transparent conductive layer thereunder. Thereby, the process of the contact window in the pixel structure may not be restricted by the size of the pixel structure and the process limitation, and the most upper layer of the patterned transparent conductive layer is electrically connected to the drain electrode indeed to provide better display quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure disposed on a substrate, the pixel structure comprising:
    a plurality of scan lines and a plurality of data lines disposed on the substrate, the scan lines being intersected with the data lines; and
    a plurality of sub-pixels, comprising:
        a plurality of switch devices, each of the switch devices being electrically connected to one of the scan lines and one of the data lines;
        a contact pattern layer;
        a plurality of color filter pattern layers, the contact pattern layer and the color filter pattern layers being disposed on the substrate and the switch devices, wherein the contact pattern layer covers at least part of two adjacent switch devices, at least two of the color filter pattern layers each includes a patterned opening, and the contact pattern layer is disposed in a space formed by the patterned openings of the at least two of the color filter pattern layers; and a plurality of pixel electrodes disposed on the color filter pattern layers, the contact pattern layer, and the switch devices, at least one pixel electrode being partially disposed between the color filter pattern layer and the corresponding switch devices while electrically connected to the switch devices, wherein each of the pixel electrodes comprises:

a first patterned transparent conductive layer disposed on the contact pattern layer and the switch devices, wherein each of the first patterned transparent conductive layers partially covers the contact pattern layer and extends to partially cover the corresponding switch device so as to contact and electrically connect to the corresponding switch device;

a second patterned transparent conductive layer disposed on the color filter pattern layer and the contact pattern layer, and the second patterned transparent conductive layer having a plurality of first contact windows to expose part of each of the first patterned transparent conductive layers; and a third patterned transparent conductive layer disposed on the second patterned transparent conductive layer, wherein the third patterned transparent conductive layer is contacted and electrically connected to the first patterned transparent conductive layer through the first contact windows.

2. The pixel structure according to claim 1, wherein each of the switch devices comprises a gate electrode electrically connected to one of the scan line correspondingly, a source electrode electrically connected to one of the data line correspondingly, and a drain electrode electrically connected to one of the pixel electrode correspondingly.

3. The pixel structure according to claim 1, wherein each of the switch devices comprises a poly-silicon transistor, and a source electrode and a drain electrode of each of the switch devices are connected to a poly-silicon layer of the poly-silicon transistor.

4. The pixel structure according to claim 1, further comprising a protective layer, wherein the protective layer covers the second patterned transparent conductive layers, the contact pattern layer, and the color filter pattern layers, and the protective layer having a plurality of second contact windows to expose part of each of the first patterned transparent conductive layers.

5. The pixel structure according to claim 4, wherein each of the first patterned transparent conductive layers is electrically connected to the corresponding third patterned transparent conductive layer through each of the first contact windows and each of the second contact windows.

6. The pixel structure according to claim 1, wherein the contact pattern layer extends from one side to another side of the one of the data lines so as to cover part of the data line.

7. The pixel structure according to claim 1, further comprising a light shielding layer, wherein the light shielding layer is disposed between the switch devices and the substrate.

8. The pixel structure according to claim 7, wherein the light shielding layer is further disposed between the scan lines and the substrate and between the data lilies and the substrate.

* * * * *